United States Patent [19]

Kang

[11] Patent Number: 5,219,777
[45] Date of Patent: Jun. 15, 1993

[54] METAL OXIDE SEMICONDUCTOR FIELD EFFECT TRANSISTOR AND METOD OF MAKING THE SAME

[75] Inventor: Dae K. Kang, Kyungki, Rep. of Korea

[73] Assignee: Gold Star Electron Co., Ltd., Rep. of Korea

[21] Appl. No.: 897,460

[22] Filed: Jun. 11, 1992

[30] Foreign Application Priority Data

Jun. 14, 1991 [KR] Rep. of Korea ............... 9872/1991

[51] Int. Cl.⁵ .................................. H01L 21/265
[52] U.S. Cl. ..................... 437/44; 437/41; 437/45; 437/54; 437/57
[58] Field of Search .......... 437/44, 45, 41, 54, 437/57, 58, 34

[56] References Cited

U.S. PATENT DOCUMENTS

| | | | |
|---|---|---|---|
| 4,904,615 | 2/1990 | Okuyama et al. | 437/45 |
| 4,931,408 | 6/1990 | Hshieh | 437/44 |
| 4,943,537 | 7/1990 | Harrington, III | 437/57 |
| 5,073,512 | 12/1991 | Yoshino | 437/41 |
| 5,081,052 | 1/1992 | Kobayashi | 437/45 |
| 5,108,935 | 4/1992 | Rodder | 437/44 |

FOREIGN PATENT DOCUMENTS

| | | | |
|---|---|---|---|
| 58-56470 | 4/1983 | Japan | 437/45 |
| 61-42963 | 3/1986 | Japan | 437/45 |
| 62-73769 | 4/1987 | Japan | 437/44 |

Primary Examiner—Brian E. Hearn
Assistant Examiner—Kevin M. Picardat

[57] ABSTRACT

A MOSFET comprising a substrate of a first conductivity type, a gate located on the substrate, a channel region of the first conductivity type located beneath a surface portion of the substrate corresponding to a region defined beneath said gate, low concentration and high concentration source regions of a second conductivity type located beneath a surface portion of the substrate corresponding to one of opposite sides of said channel region, and low concentration and high concentration drain regions of the second conductivity type located beneath a surface portion of the substrate corresponding to the other of opposite sides of the channel region. A pair of first impurity regions of the first conductivity type are located to surround said second conductivity type low concentration source region and said second conductivity type low concentration drain region respectively. Also, a second impurity region of the first conductivity type is located within a portion of the bulk substrate spaced a predetermined distance beneath the surface of the substrate.

12 Claims, 12 Drawing Sheets

F I G. 5
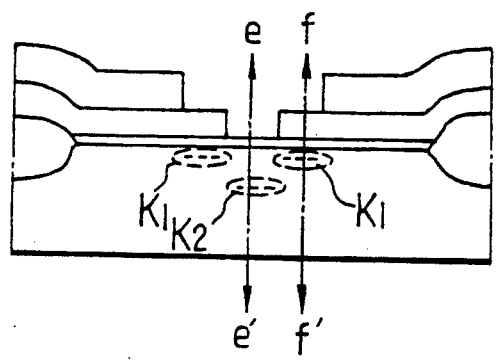
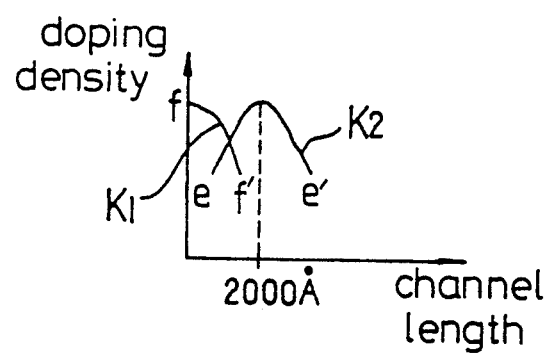

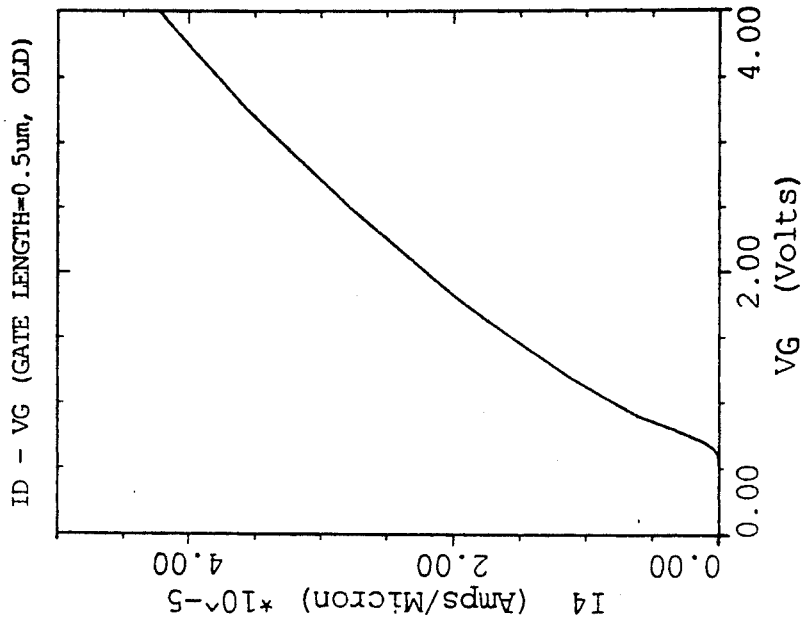
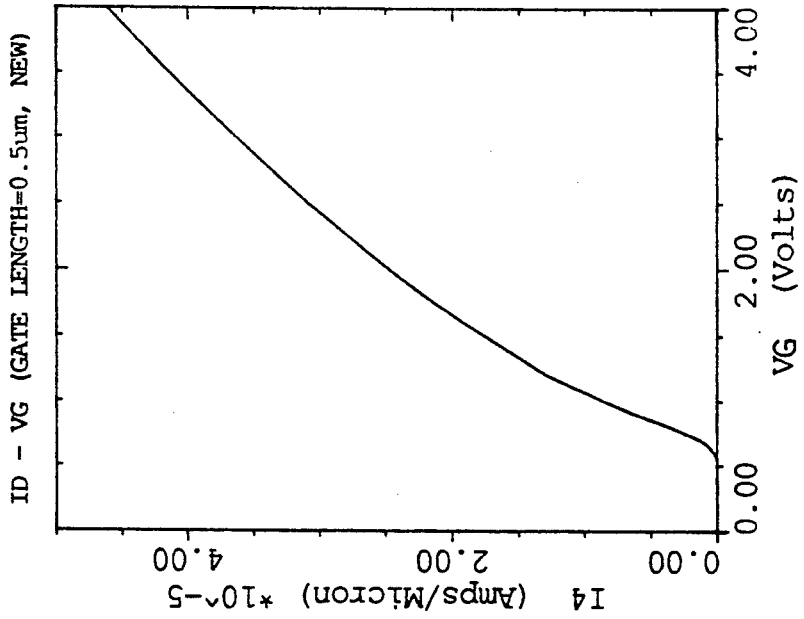

METAL OXIDE SEMICONDUCTOR FIELD EFFECT TRANSISTOR AND METOD OF MAKING THE SAME

BACKGROUND OF THE INVENTION

1. Field of the Invention

The present invention relates to a metal oxide semiconductor field effect transistor, and more particularly to a metal oxide semiconductor with a lightly doped drain structure and a method of making the same.

2. Description of the Prior Art

As well-known in the technical field, such a metal oxide semiconductor field effect transistor (MOSFET) with a lightly doped drain (LDD) structure is adapted to utilize the following effects: That is, when a given voltage is applied to a gate, a channel region is defined between a source region and a drain region, so that electrons move from the source region to the drain region along the channel region.

A most typical method of making such a prior art MOSFET with a LDD structure will now be described, in conjunction with FIGS. 1A to 1C.

FIGS. 1A to 1C are cross-sectional views illustrating a method of making a MOSFET with a conventional LDD structure. As shown in FIG. 1A, a gate oxide film 22 is grown over the entire surface of a p type silicon substrate 21.

An implantation of p type channel ions is achieved at regions including a channel region, so as to control a threshold voltage and particularly suppress a threshold voltage of a punch through possibly occurring along with a short channel.

On the gate oxide film 22, a polysilicon layer is formed, as shown in FIG. 1B. By patterning the polysilicon layer, a gate 23 is formed. For the LDD structure, low concentration n (n⁻) type source and drain regions 24 and 24a are then formed using a method of implanting low concentration n type ions and using the gate 23 as a mask.

Thereafter, an oxide film is formed using a chemical vapor deposition (CVD) method, as shown in FIG. 1C. The oxide film is then etched back to form side wall oxide films 25 and 25a at opposite side walls of the gate 23.

High concentration n (n+) type source and drain regions 26 and 26a are then formed using a method of implanting high concentration n type ions and using the gate 23 and the gate side wall oxide films 25 and 25a as a mask. Thus, a MOSFET with the above-mentioned LDD structure is obtained as shown in FIG. 1C.

The characteristic of the MOSFET having the LDD structure shown in FIGS. 1A to 1C is that low concentration p type (p⁻) ions implanted in the entire surface of an active region of the p type silicon substrate 1 serve to control a threshold voltage and avoid an occurrence of bulk punch through.

Referring to FIG. 2, there is illustrated another MOSFET with a conventional LDD structure. The structure is the same as that of FIGS. 1A to 1C, except for a low concentration p type region 27. Accordingly, a description of a method for making the structure will be omitted.

In the structure of FIG. 2, this low concentration p type region 27 serves to avoid an occurrence of bulk punch through.

Referring to FIG. 3, there is illustrated another MOSFET with a conventional LDD structure. The structure is the same as that of FIGS. 1A to 1C, except that a low concentration p type region 28 is formed at a portion of a bulk substrate beneath a gate. The substrate bulk corresponds to the channel region. Accordingly, a description of a method for making the structure will be omitted.

In the structure of FIG. 3, this low concentration p type region 28 serves to control the threshold voltage and avoid an occurrence of bulk punch through. This technique has been proposed in the Korean Patent Application No. 91-7881, which is co-pending as U.S. patent application 07/883,857, filed May 15, 1992.

However, the above-mentioned prior art devices have the following problems.

First, in case of the structure shown in FIG. 1C, the low concentration p type region is presented throughout the entire active region, thereby causing a junction capacitance to substantially increase. Since a potential barrier at the channel region is totally very high, the mobility of electrons from the source region to the drain region is therefore greatly reduced.

Second, in case of the structure shown in FIG. 2, the junction capacitance is also very high, in that the entire low concentration p type region is bonded to the low and high concentration n type source/drain regions. Since the channel region does not include the low concentration p type region, it is difficult to avoid an occurrence of bulk punch through at that region.

Third, in case of the structure shown in FIG. 3, since the low concentration p type region is located at the center portion of the channel region and extends from the surface of the p type silicon substrate toward the bulk, it thereby causes the potential barrier at that region to be very high. As a result, the mobility of electrons is reduced.

Generally, the punch through phenomenon means an interconnection between source and drain regions without any channel region when a given voltage is applied to those regions. Such a punch through can refer to either a surface punch through and a bulk punch through. On the other hand, the threshold voltage means the critical value of a gate voltage making it possible to conduct a current between source and drain regions. The level of the threshold voltage is controlled by an implantation of low concentration p type ions (namely, a channel ion implantation). In this case, such a channel ion implantation is carried out for controlling the threshold voltage, so as to avoid an occurrence of punch through.

SUMMARY OF THE INVENTION

Therefore, an object of the invention is to provide a MOSFET with a LDD structure capable of avoiding an occurrence of punch through at the bulk portion of a substrate and a method of making the same.

Another object of the invention is to provide a MOSFET with a LDD structure capable of reducing the junction capacitance and a method of making the same.

Another object of the invention is to provide a MOSFET with a LDD structure capable of improving a mobility of electrons in the channel region.

In one aspect, the present invention provides a metal oxide semiconductor field effect transistor comprising: a semiconductor substrate of a first conductivity type; a gate located on said substrate; a channel region of the first conductivity type located beneath a surface portion of the substrate corresponding to a region defined beneath said gate; low concentration and high concentration source regions of a second conductivity type located beneath a surface portion of the substrate corresponding to one of opposite sides of said channel region; low concentration and high concentration drain regions of the second conductivity type located beneath a surface portion of the substrate corresponding to the other of opposite sides of the channel region; a pair of first impurity regions of the first conductivity type located to surround said second conductivity type low concentration source region and said second conductivity type low concentration drain region, respectively; and a second impurity region of the first conductivity type located in the channel region within a portion of the bulk substrate spaced a predetermined distance beneath the surface of the substrate.

In another aspect, the present invention also provides a method of making a metal oxide semiconductor field effect transistor comprising the steps of: defining an active region and a field region in a substrate of a first conductivity type by forming a field oxide film over the field region; forming a first insulation film and a second insulation film, in this order, on the entire regions of said substrate; patterning said second insulation film located in said active region to remove a portion of the said second insulation film corresponding to a gate region and thus expose a portion of said first insulation film through said removed portion of the second insulation film; patterning said exposed portion of the first insulation film to remove its part having a width narrower than the width of said gate region and thus leave a part of the first insulation film having a predetermined width not covered with the second insulation film; implanting a channel impurity of the first conductivity type at a predetermined concentration in regions located beneath surface portions of the substrate corresponding to opposite edges of the gate region in the bulk substrate below a center portion of a channel region, using the remaining second insulation film located beyond the gate region, as a mask; forming a pair of first impurity regions at said regions located beneath said substrate surface portions corresponding to opposite edges of the gate region, respectively, and a second impurity region in said bulk substrate in a region corresponding to said center portion of the channel region; removing a portion of the first insulation film remaining at the opposite edges of the gate region; forming a gate at a region shaped into a concave shape by the removal of first and second insulation films; removing all portions of the first and second insulation films remaining beyond the gate region; implanting a low concentration impurity of a second conductivity type using said gate as a mask, to form low concentration source and drain regions in the substrate; forming side wall insulation films at opposite side surfaces of the gate; and implanting a high concentration impurity of a second conductivity type using the gate and said side wall insulation films as a mask, to form high concentration source and drain regions in the substrate.

BRIEF DESCRIPTION OF THE DRAWINGS

Other objects and aspects of the invention will become apparent from the following description of embodiments with reference to the accompanying drawings in which:

FIG. 5B is a doping profile in the regions designated in the cross-sectional view of FIG. 5A.

FIG. 4F is a channel region at the step of implanting low concentration p type impurity ions;

FIG. 10A is a graph illustrating the electron mobility in case of the structure of FIG. 4M; and FIG. 10B is a graph illustrating the electron mobility in case of the structure of FIG. 1C.

DETAILED DESCRIPTION OF THE INVENTION

Referring to FIGS. 4A to 4M, there is illustrated a method of making a MOSFET with a LDD structure according to the present invention.

Figure 4A:
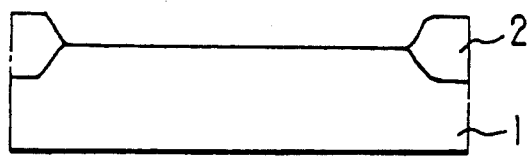
FIGS. 4A to 4M are cross-sectional views illustrating a method of making a MOSFET according to the present invention.
Figure 4B:
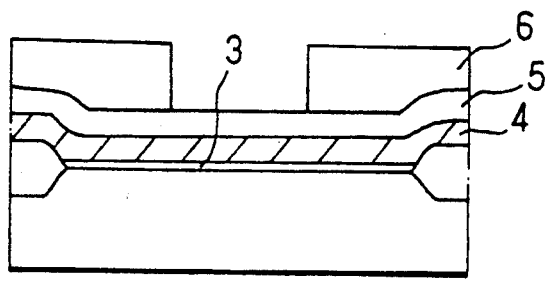

In accordance with the method, first, on a p type silicon substrate 1, a field oxide film 2 is formed to define a field region and an active region, as shown in FIG. 4A. A pad oxide film 3 is then formed on the field oxide film 2. On the entire exposed surface, a nitride film 4 and an oxide film 5 are formed in this order, as shown in FIG. 4B. Thereafter a photoresist 6 is formed to define a gate region on the entire exposed surface. In this case, the pad oxide film, namely, first oxide film 3, the nitride film 4 and the second oxide film 5 should have different etch selectivities from one another.

Figure 4C:
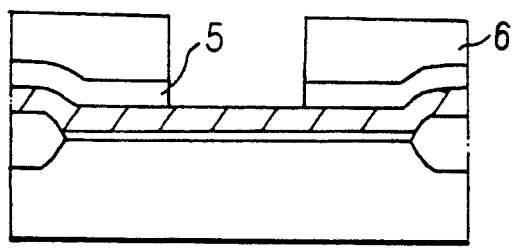

As shown in FIG. 4C, the second oxide film 5 is then subjected to an etching using the photoresist 6 as a mask, so as to remove its portion located at the gate region.

Figure 4D:
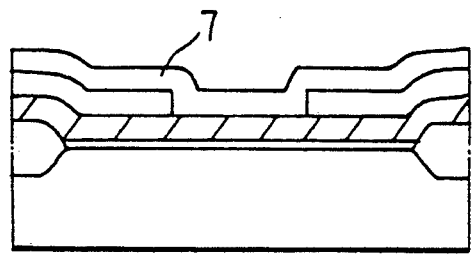

Following a removal of the photoresist 6, a predetermined thickness of a polysilicon film 7 is deposited on the entire exposed surface using the CVD method, as shown in FIG. 4D. In this case, the polysilicon film 7 should have an etch selectivity different from those of the nitride film 4 and the second oxide film 5. This polysilicon film 7 for forming side walls may alternatively have substituted for it a semiconductor film or an insulation film having a different etch selectivity.

Figure 4E:
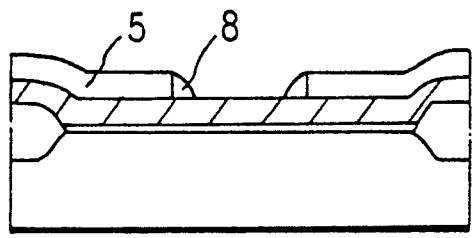
Figure 4F:
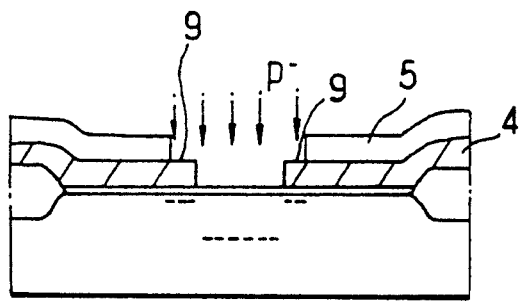

As shown in FIG. 4E, the polysilicon film 7 is subjected to an anisotropic dry etching using a reactive ion etching (RIE) method, so that side wall polysilicon films 8 are formed at both side surfaces of the gate region, respectively. Using the remaining second oxide film 5 and the side wall polysilicon films 8 as a mask, the nitride film 4 is dry etched to be removed in a width narrower than that of the gate region, as shown in FIG. 4F. Subsequently, the side wall polysilicon films 8 are removed. At this time, the nitride film 4 has exposed portions which are located at opposite edges of the gate and not covered with the second oxide film 5.

Thereafter, low concentration p type (p⁻) impurity ions are implanted in the p type silicon substrate 1 using a predetermined energy. In the implantation, the remaining second oxide film 5 is used as a mask. The low concentration p type impurity ions pass through the nitride film 4 and the first oxide film 3 and are then implanted in respective regions located beneath surface portions of the p type silicon substrate 1 corresponding to opposite edges of the gate region. The low concentration p type impurity ions are also implanted in a bulk in the p type silicon substrate 1. The bulk corresponds to the channel region. The low concentration p type impurity ion regions located beneath opposite edges of the gate region have a shallower depth and a lower concentration than those of the bulk region, namely, the channel region, since impurity ions implanted in the former regions pass through portions of the nitride film 9 and the first oxide film 3.

Figure 4G:
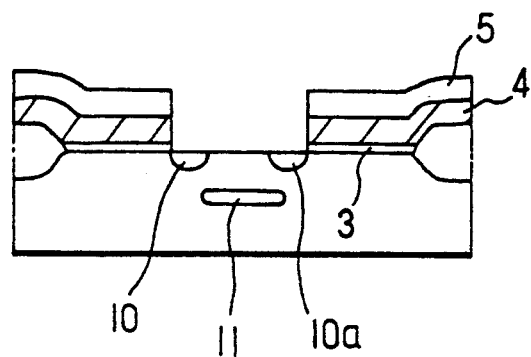

An annealing step is then performed to achieve a diffusion of the implanted low concentration p type impurity ions, so as to form two first p type impurity regions 10 and 10a and a second p type impurity regions 11 corresponding to the above-mentioned three impurity ion implanted regions, respectively, as shown in FIG. 4G.

Figure 4H:
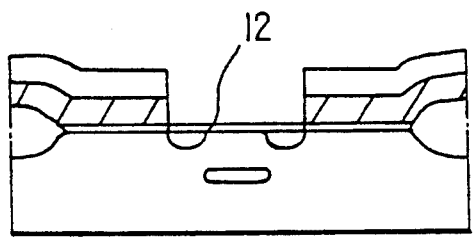
Figure 4I:
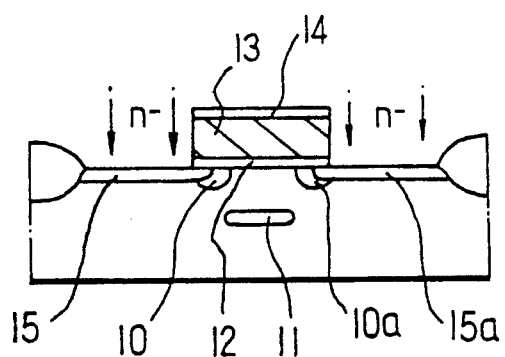

Subsequently, a gate oxide film 12 is deposited on the p type silicon substrate 1 within the gate region, using the CVD method, as shown in FIG. 4H. On the gate oxide film 12, a gate polysilicon electrode 13 and a gate cap oxide film 14 are formed, as shown in FIG. 4I. Thereafter, all the first oxide film 3, the nitride film 4 and the second oxide 5 remaining beyond the gate region are removed, as shown in FIG. 4I. Using the gate cap oxide film 14 as a mask, low concentration n type (n⁻) impurity ions are implanted in the p type silicon substrate 1, thereby forming low concentration source and drain regions 15 and 15a at opposite sides of the mask, respectively. In this case, the low concentration source and drain regions 15 and 15a are surrounded with the first p type impurity regions 10 and 10a, respectively.

Figure 4J:
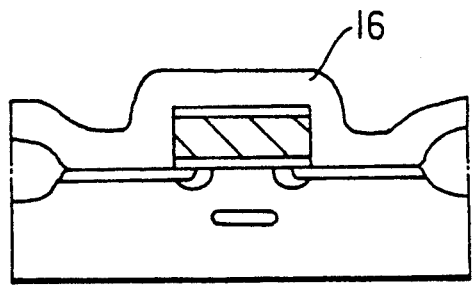
Figure 4K:
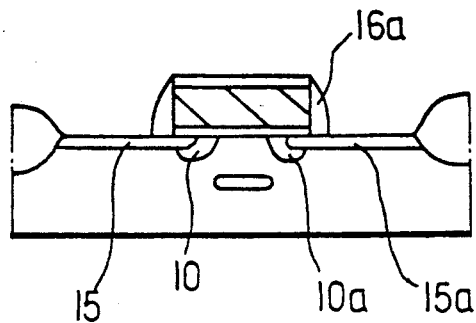

On the entire exposed surface, a third oxide film 16 is then deposited using the CVD method, as shown in FIG. 4J. The third oxide film 16 is subjected to the anisotropic dry etching using, in the preferred embodiment, the RIE method, so that gate side wall oxide films 16a are formed at opposite sides of the gate region, respectively, as shown in FIG. 4K. This third oxide film 16 may be, alternatively, have substituted for it other insulation films or semiconductor films.

Figure 4L:
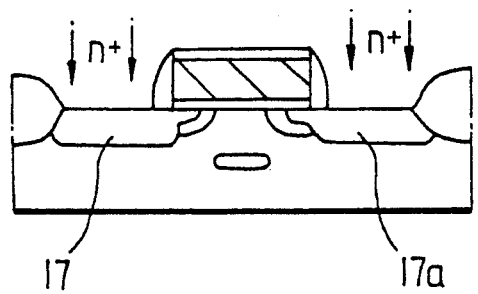

Using the gate cap oxide film 14 and the gate side wall oxide films 16a as a mask, high concentration n type (n⁺) impurity ions are then implanted in the p type silicon substrate 1, thereby forming high concentration n type source and drain regions 17 and 17a at opposite sides of the mask, respectively, as shown in FIG. 4L.

Figure 4M:
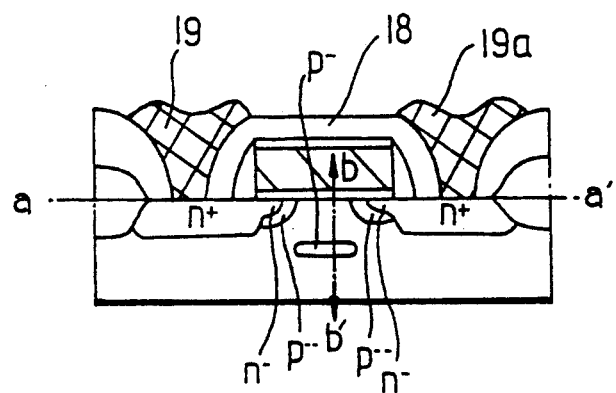

Thereafter, a fourth oxide film 18 is formed on the entire exposed surface and then subjected to a dry etching, so as to form buried contacts at respective surfaces of high concentration n type source and drain regions 17 and 17a, as shown in FIG. 4M. As a metal is deposited on the buried contacts, a source electrode 19 and a drain electrode 19a are formed. In addition to such a metal, the material of these electrodes 19 and 19a may alternatively include polysilicon doped with impurity ions having a certain conductivity.

FIG. 5B illustrates a doping profile in regions K1 and K2, as shown in the cross-sectional view of FIG. 5A, at the step of implanting low concentration p type impurity ions as shown in FIG. 4F. By referring to FIG. 5B, it can be seen that the regions K1 have peak values of doping concentrations at their portions nearest to source and drain regions, respectively. On the other hand, the region K2 has a peak value of doping concentration at its center portion.

Accordingly, as apparent from FIG. 5B, the K1 regions have doping concentrations increasing gradually up to peak values as they extend toward source and drain regions, respectively. Such an increase in the doping concentration makes it possible to avoid an occurrence of the punch through phenomenon in the regions K1 and to control the threshold voltage. An occurrence of bulk punch through phenomenon in the region K2 is also avoided, in that the doping concentration in the region K2 has its peak value at the center portion, that is, the portion corresponding to the center portion of the channel region.

The superiority of the present invention compared with the prior art will now be evaluated, in conjunction with FIGS. 6A to 9. In the evaluation, a gate length of 0.5 μm was commonly used.

Figure 1A:
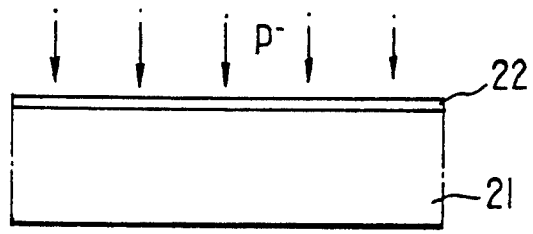
FIGS. 1A to 1C are cross-sectional views illustrating a method of making a MOSFET in accordance with a prior art.
Figure 1B:
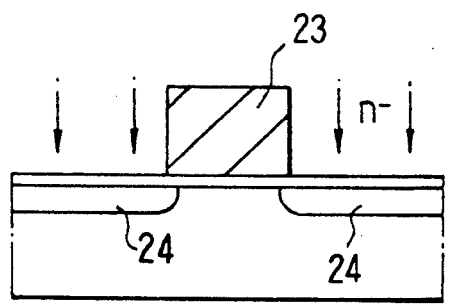
Figure 1C:
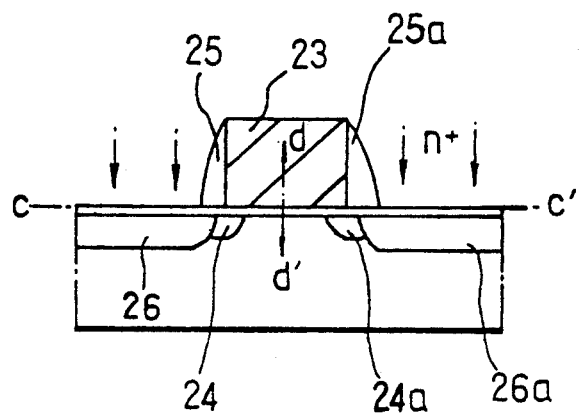
Figure 2:
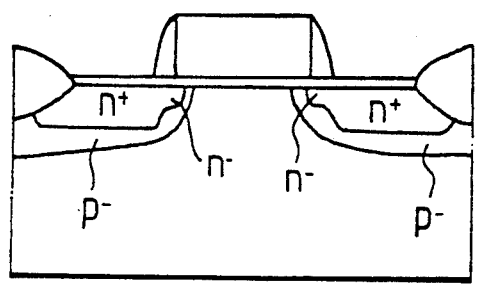
FIG. 2 is a cross-sectional view of another conventional MOSFET.
Figure 3:
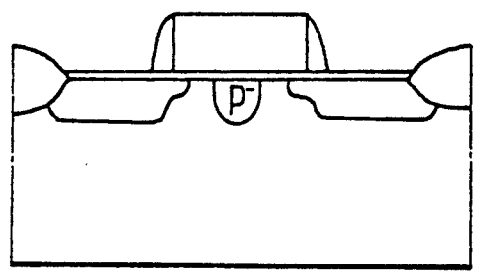
FIG. 3 is a cross-sectional view of another conventional MOSFET.
Figure 6A:
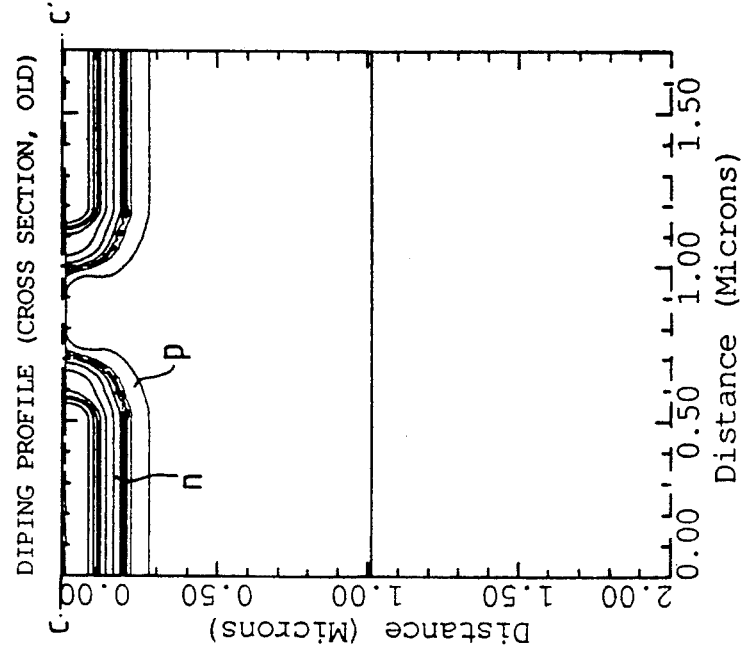
FIG. 6A shows doping profiles of n type and p type impurity ions taken beneath the line a—a' in FIG. 4M.
Figure 6B:
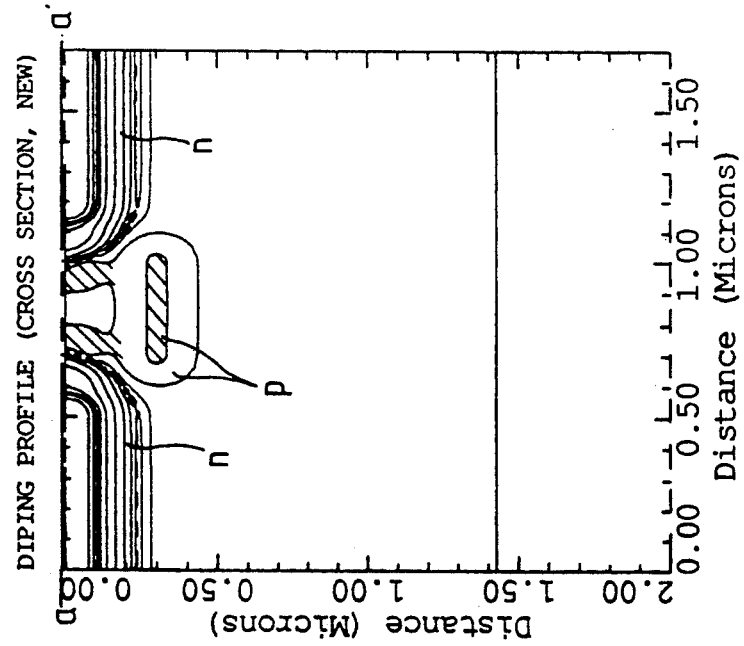
FIG. 6B shows doping profiles of n type and p type impurity ions taken beneath the line c—c' in FIG. 1C.
Figure 7B:
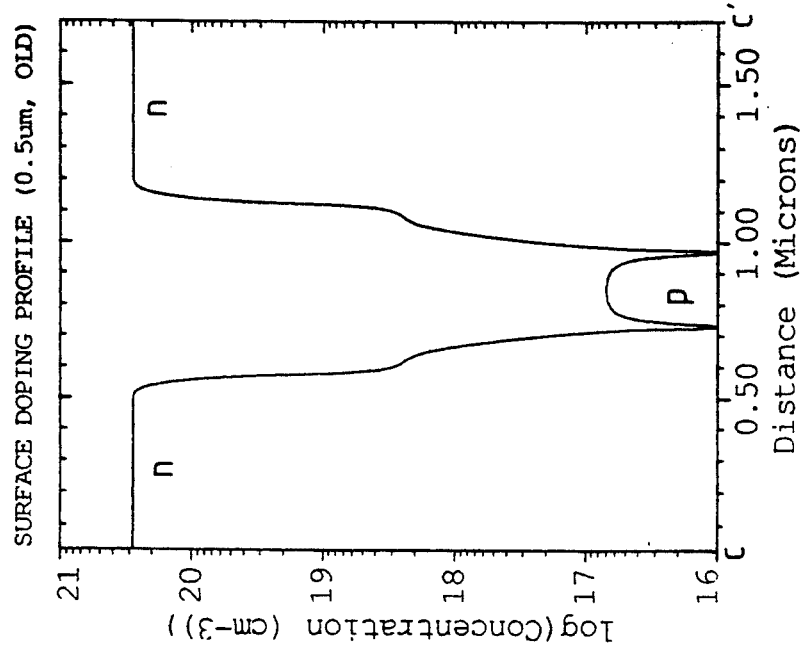
FIG. 7B shows doping profiles of n type and p type impurity ions taken along the line c—c' in FIG. 1C.
Figure 7A:
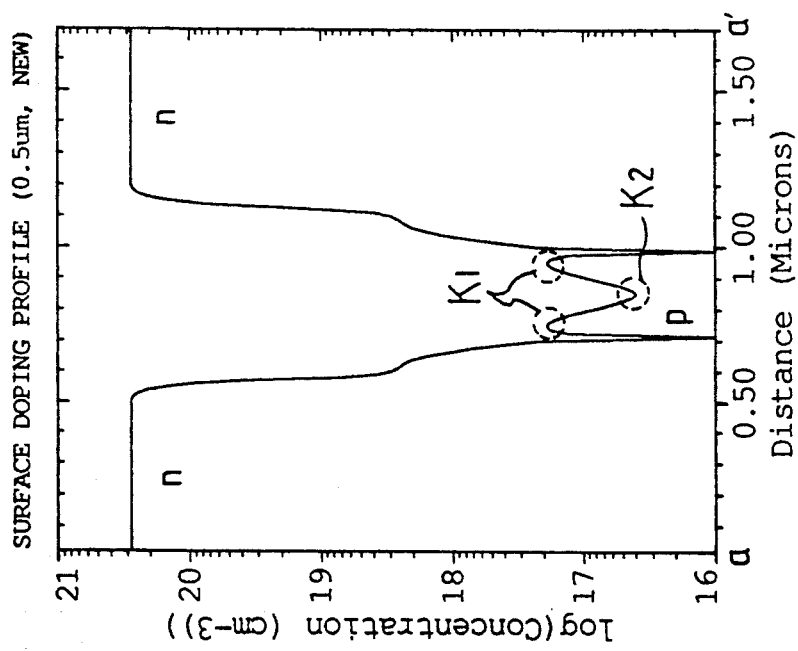
FIG. 7A shows doping profiles of n type and p type impurity ions taken along the line a—a' in FIG. 4M.
Figure 8A:
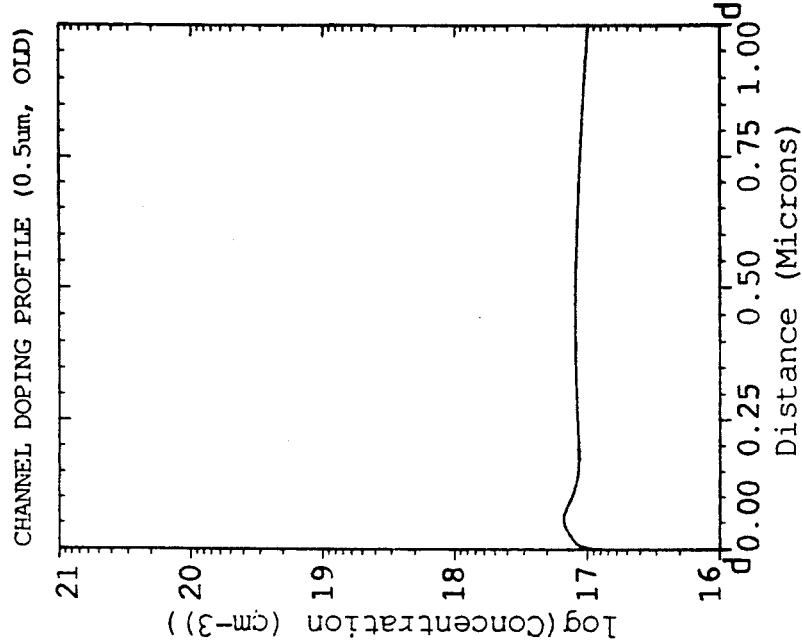
FIG. 8A is a doping profile of p type impurity ions taken along the line b—b' in FIG. 4M.
Figure 8B:
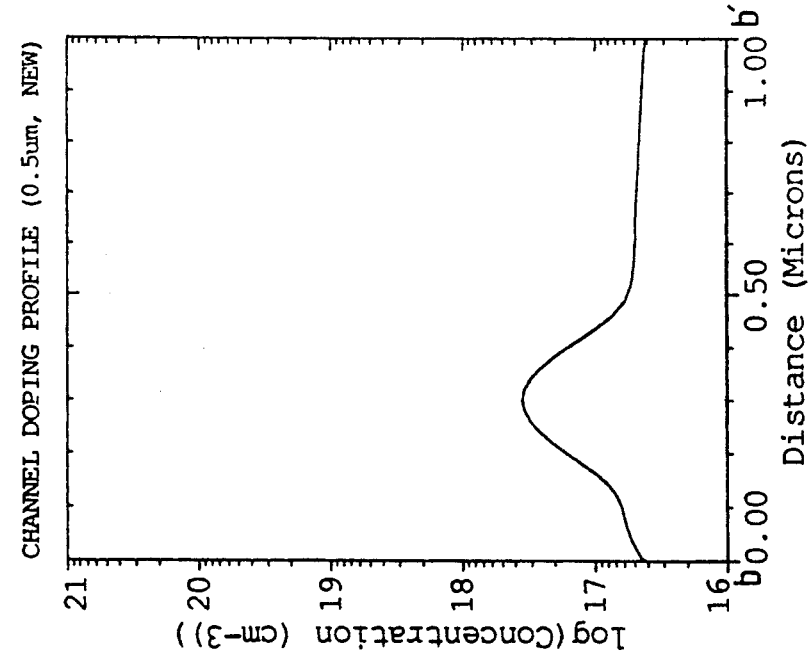
FIG. 8B is a doping profile of p type impurity ions taken along the line d—d' in FIG. 1C.

FIG. 6A shows doping profiles of n type and p type impurity ions taken along a depth from the substrate surface to the substrate bulk in FIG. 4M according to the present invention, whereas FIG. 6B shows doping profiles of n type and p type impurity ions taken along a depth from the substrate surface to the substrate bulk in FIG. 1C according to the prior art. FIG. 7A shows doping profiles of n type and p type impurity ions taken along the line a—a' (namely, the surface of the p type silicon substrate) in FIG. 4M, whereas FIG. 7B shows doping profiles of n type and p type impurity ions taken along the line c—c' (namely, the surface of the p type silicon substrate) in FIG. 1C. On the other hand, FIG. 8A shows a doping profile of p type impurity ions taken along the line b—b' in the channel region of FIG. 4M, whereas FIG. 8B shows a doping profile of p type impurity ions taken along the line d—d' in the channel region of FIG. 1C.

In case of FIG. 6A, the doping profile of p type impurity ions exhibits a maximum value at the hatched portions in the channel region in accordance with the present invention. Accordingly, the potential profile at those portions becomes high. As a result, it is possible to easily control the threshold voltage thereby avoiding an occurrence of punch through and prevent an occurrence of bulk punch through. In case of FIG. 6B according to the prior art, the doping profile of p type impurity ions exhibits a low value in the channel region. As a result, a bulk punch through may occur.

In case of FIG. 7A, the doping concentration of p type impurity ions exhibits a peak value at regions corresponding to the regions K1 (namely, opposite edges of the gate region), in accordance with the present invention. As a result, it is possible to easily control the threshold voltage and thus avoid an occurrence of surface punch through. The doping concentration of p type impurity ions also exhibits a peak value at a region corresponding to the region K2 (namely, the portion located beneath the channel region). As a result, it is possible to avoid an occurrence of bulk punch through.

By virtue of the regions K1 and K2, there is also an improvement in the mobility of electrons. In case of FIG. 7B according to the prior art, the doping profile of p type impurity ions is totally uniform in the channel region. Consequently, the possibility of an occurrence of bulk punch through becomes high. Furthermore, the mobility of electrons is reduced.

In case of FIG. 8A according to the present invention, the doping concentration of p type impurity ions exhibits a peak value at a region located beneath the center portion of channel region. Accordingly, an occurrence of bulk punch through is avoided. In case of FIG. 8B according to the prior art, the doping profile of p type impurity ions is totally uniform in the channel region. Consequently, the possibility of an occurrence of bulk punch through becomes high.

Figure 9A:
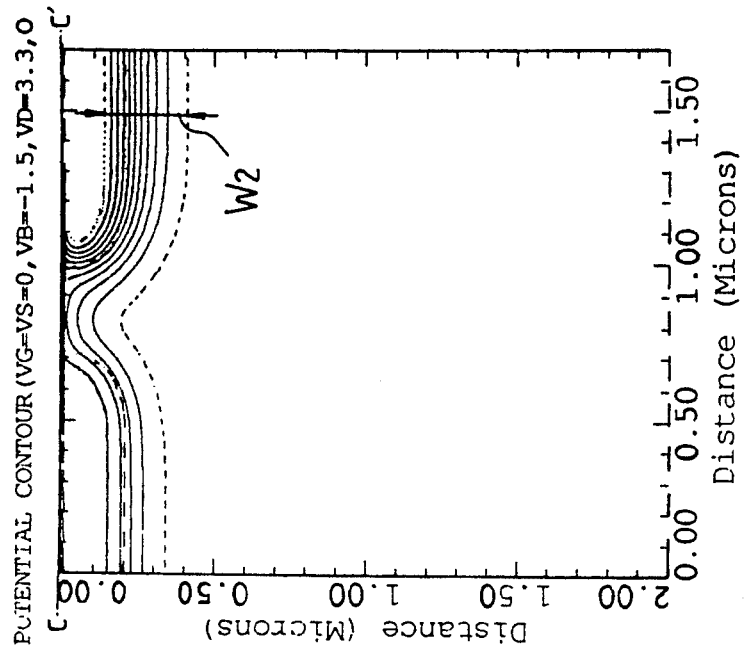
FIG. 9A is a potential contour taken along the line a—a' in FIG. 4M.
Figure 9B:
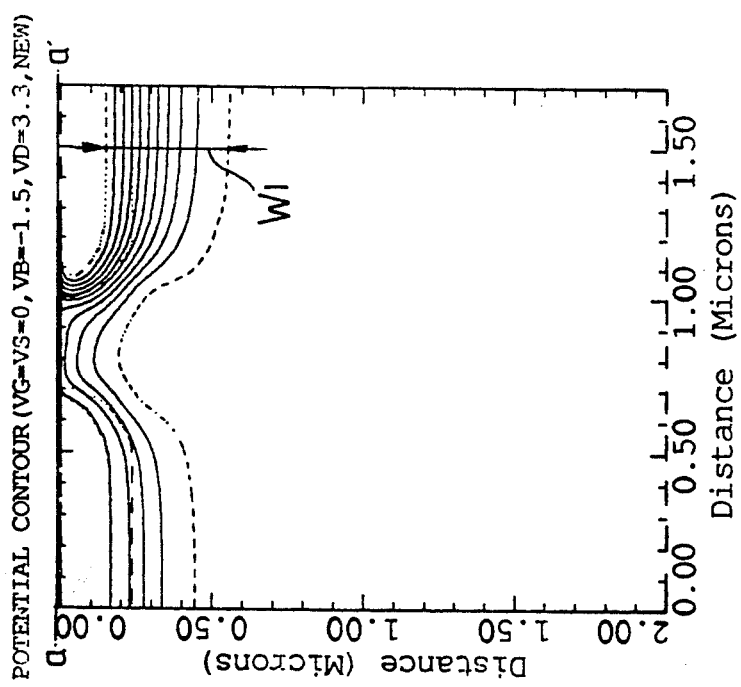
FIG. 9B is a potential contour taken along the line c—c' in FIG. 1C.

FIG. 9A shows a potential contour taken along the line a—a' in FIG. 4M according to the present invention, whereas FIG. 9B shows a potential contour taken along the line c—c' in FIG. 1C according to the prior art.

Referring to FIG. 9A, it can be found that the channel region located beneath the gate exhibits high potential and that the width W1 of a depletion region is relatively wide. On the other hand, in case of FIG. 9B, the channel region located beneath the gate exhibits lower potential than that of FIG. 9A. Also, the width W2 of a depletion region is narrower than the width W1 of FIG. 9A.

On the other hand, the junction capacitance C between the n type source/drain regions and the p type silicon substrate is inversely proportional to the square root of the width W of depletion region, as expressed by the following equation (1):

$$C \propto \frac{1}{\sqrt{W}} \quad (1)$$

Therefore, the structure of the present invention exhibits a relatively low junction capacitance, as compared with the prior art.

In the channel region, current flows generally along the surface of the substrate. FIG. 10A shows the amount of current $I_D$ varying depending on the variation in the gate voltage $V_G$, in case of the structure of FIG. 1C according to the prior art. Referring to FIGS. 10A and 10B, it can be found that upon the variation in the gate voltage $V_G$, the case shown in FIG. 10A exhibits a larger amount of current flow than that of FIG. 10B. Accordingly, the structure of the present invention has a superior electron mobility characteristic, as compared with the prior art.

As apparent from the above description, the present invention provides a MOSFET with a LDD structure wherein the doping concentration of channel ions exhibits a peak value at opposite edges of a gate and a substrate bulk located beneath a channel region With this structure, it is possible to avoid an occurrence of bulk punch through, reduce the junction capacitance and enhance the electron mobility.

Although the preferred embodiments of the invention have been disclosed for illustrative purpose, those skilled in the art will appreciated that various modifications, additions and substitutions are possible, without departing from the scope and spirit of the invention as disclosed in the accompanying claims.

What is claimed is:

1. A method of making a metal oxide semiconductor field effect transistor comprising the steps of:
    defining an active region and a field region in a substrate of a first conductivity type by forming a field oxide film over the field region;
    forming a first insulation film and a second insulation film, in this order, on the entire regions of said substrate;
    patterning said second insulation film located in said active region to remove a portion of said second insulation film corresponding to a gate region and thus expose a portion of said first insulation film through said removed portion of the second insulation film;
    patterning said exposed portion of the first insulation film to remove its part having a width narrower than the width of said gate region and thus leave a part of the first insulation film having a predetermined width not covered with the second insulation film;
    implanting a channel impurity of the first conductivity type at a predetermined concentration in regions located beneath surface portions of the substrate corresponding to opposite edges of the gate region and in the bulk substrate below the center portion of a channel region, using the remaining second insulation film located beyond the gate region, as a mask;
    forming a pair of first impurity regions at said regions located beneath said substrate surface portions corresponding to opposite edges of the gate region, respectively, and a second impurity region in said bulk substrate in a location corresponding to said center portion of the channel region;
    removing a portion of the first insulation film remaining at the opposite edges of the gate region;
    forming a gate at a region shaped into a concave shape by the removal of first and second insulation films;
    removing all portions of the first and second insulation films remaining beyond the gate region;
    implanting a low concentration impurity of a second conductivity type using said gate as a mask, to form low concentration source and drain regions in the substrate;
    forming side wall insulation films at opposite side surfaces of the gate; and
    implanting a high concentration impurity of a second conductivity type using the gate and said side wall insulation films as a mask, to form high concentration source and drain regions in the substrate.

2. A method of making a metal oxide semiconductor field effect transistor in accordance with claim 1, wherein a pad insulation film is formed prior to said step of forming said first insulation film and removed along with the first insulation film at said step of removing the first insulation film carried out after the implantation of said channel impurity of the first conductivity type in the substrate.

3. A method of making a metal oxide semiconductor field effect transistor in accordance with claim 1, wherein said step of leaving a part of the first insulation film having a predetermined width not covered with the second insulation film comprises the steps of:
    forming a third insulation film over the entire exposed surface after the formation of said concave region formed by the removal of the second insulation film from the gate region, said third insulation film having an etch selectivity different from those of said first and second insulation films;

etching the third insulation film, to form side wall insulation films at opposite side surfaces of the concave region, respectively;

etching the first insulation film using the second insulation film remaining beyond the gate region and said side wall insulation films as a mask, to remove a portion of the first insulation film having a width narrower than the width of the gate; and removing the side wall insulation films.

4. A method of making a metal oxide semiconductor field effect transistor in accordance with claim 3, wherein said step of etching the third insulation film comprises an anisotropic dry etching.

5. A method of making a metal oxide semiconductor field effect transistor in accordance with claim 4, wherein said anisotropic dry etching is a reactive ion etching.

6. A method of making a metal oxide semiconductor field effect transistor in accordance with claim 3, wherein a material of said side wall insulation films is a semiconductor material having an etch selectivity different from those of said first and second insulation films.

7. A method of making a metal oxide semiconductor field effect transistor in accordance with claim 1, wherein said first and second insulation films have different etch selectivities from each other.

8. A method of making a metal oxide semiconductor field effect transistor in accordance with claim 1, wherein said second impurity region has a high concentration and a deeper depth from the substrate surface than those of said first impurity region.

9. A method of making a metal oxide semiconductor field effect transistor in accordance with claim 1, wherein said step of forming the gate comprises the steps of:

forming a gate insulation film on the exposed substrate surface;

forming a gate electrode on said gate insulation film; and forming a gate cap insulation film on said gate electrode.

10. A method of making a metal oxide semiconductor field effect transistor in accordance with claim 1, wherein said first conductivity type and said second conductivity type are p type and n type, respectively.

11. A method of making a metal oxide semiconductor field effect transistor in accordance with claim 9, wherein a material of said gate electrode is polysilicon doped with impurity ions of a predetermined conductivity type.

12. A method of making a metal oxide semiconductor field effect transistor in accordance with claim 9, wherein a material of said gate electrode is metal.

* * * * *